(12) United States Patent
Jeong

(10) Patent No.: US 10,031,678 B2
(45) Date of Patent: Jul. 24, 2018

(54) STORAGE DEVICE, DATA STORAGE DEVICE INCLUDING THE SAME, AND OPERATION METHOD THEREOF

(71) Applicant: SAMSUNG ELECTRONICS CO., LTD., Suwon-si, Geyonggi-Do (KR)

(72) Inventor: Yong-Taek Jeong, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 265 days.

(21) Appl. No.: 14/966,738

(22) Filed: Dec. 11, 2015

(65) Prior Publication Data

US 2016/0202921 A1 Jul. 14, 2016

(30) Foreign Application Priority Data

Jan. 9, 2015 (KR) ........................ 10-2015-0003372

(51) Int. Cl.
| | | |
|---|---|---|
| G06F 3/06 | (2006.01) | |
| G06F 13/42 | (2006.01) | |
| G06F 12/02 | (2006.01) | |
| G06F 13/40 | (2006.01) | |
| G06F 12/06 | (2006.01) | |
| G11C 7/10 | (2006.01) | |

(52) U.S. Cl.
CPC .......... *G06F 3/0614* (2013.01); *G06F 3/0661* (2013.01); *G06F 3/0685* (2013.01); *G06F 12/0238* (2013.01); *G06F 12/0253* (2013.01); *G06F 12/0638* (2013.01); *G06F 13/4022* (2013.01); *G06F 13/4282* (2013.01); *G11C 7/1072* (2013.01); *G06F 2212/202* (2013.01); *G06F 2212/205* (2013.01)

(58) Field of Classification Search
CPC .. G06F 3/0614; G06F 13/4282; G06F 3/0685; G06F 3/0661; G06F 12/0253; G06F 13/4022; G06F 12/0238; G06F 12/0638; G06F 2212/202; G06F 2212/205; G11C 7/1072

See application file for complete search history.

(56) References Cited

U.S. PATENT DOCUMENTS

| | | | |
|---|---|---|---|
| 7,562,176 B2 | 7/2009 | Kloeppner et al. | |
| 7,679,133 B2 | 3/2010 | Son et al. | |
| 8,200,880 B2 | 6/2012 | Higuchi et al. | |
| 8,553,466 B2 | 10/2013 | Han et al. | |
| 8,559,235 B2 | 10/2013 | Yoon et al. | |

(Continued)

FOREIGN PATENT DOCUMENTS

| | | |
|---|---|---|
| JP | 2011-164838 | 8/2011 |
| JP | 2013-097718 | 5/2013 |

*Primary Examiner* — Idriss N Alrobaye
*Assistant Examiner* — Ronald T Modo
(74) *Attorney, Agent, or Firm* — F. Chau & Associates, LLC

(57) ABSTRACT

An operation method of a data storage system including storage devices includes transmitting a packet to a host including information indicating whether the storage devices are capable of resource sharing; transmitting ID information of the storage devices capable of resource to the host; transmitting by a requesting device among the capable storage devices a resource sharing request message to the remaining storage devices capable of resource sharing; and performing the resource sharing on at least one of the remaining storage devices.

20 Claims, 11 Drawing Sheets

(56) References Cited

U.S. PATENT DOCUMENTS

| | | |
|---|---|---|
| 8,595,343 B2 | 11/2013 | Cherian et al. |
| 8,601,198 B2 | 12/2013 | Teh et al. |
| 8,615,623 B2 * | 12/2013 | Hidaka ............... G06F 13/4022 |
| | | 710/312 |
| 8,654,587 B2 | 2/2014 | Yoon et al. |
| 8,914,556 B2 | 12/2014 | Magro et al. |
| 2006/0209722 A1 | 9/2006 | Takeo et al. |
| 2010/0019310 A1 * | 1/2010 | Sakamoto ......... H01L 27/11578 |
| | | 257/324 |
| 2011/0233648 A1 | 9/2011 | Seol et al. |
| 2013/0297857 A1 * | 11/2013 | Sela ..................... G06F 9/5027 |
| | | 711/103 |
| 2014/0115223 A1 | 4/2014 | Guddeti et al. |
| 2015/0162069 A1 * | 6/2015 | Matsushima ............ G11C 7/04 |
| | | 365/227 |

* cited by examiner

US 10,031,678 B2

STORAGE DEVICE, DATA STORAGE DEVICE INCLUDING THE SAME, AND OPERATION METHOD THEREOF

CROSS-REFERENCE TO RELATED APPLICATIONS

This U.S. non-provisional patent application claims priority under 35 U.S.C. § 119 to Korean Patent Application No. 10-2015-0003372, filed on Jan. 9, 2015, the disclosure of which is incorporated by reference herein.

BACKGROUND

1. Technical Field

The inventive concept relates to a storage device, a data storage device including the same and an operation method thereof.

2. Discussion of Related Art

A storage device stores data under the control of a host device such as a computer, a smart phone and a smart pad. A storage device includes a device storing data, a magnetic disk like a hard disk drive (HDD) and a device storing data in a semiconductor memory such as a solid state drive (SSD) and a memory card, in particular, in a nonvolatile memory.

A nonvolatile memory includes a read only memory (ROM), a programmable ROM (PROM), an electrically programmable ROM (EPROM), an electrically erasable and programmable ROM (EEPROM), a flash memory, a phase change RAM (PRAM), a magnetic RAM (MRAM), a resistive RAM (RRAM), a ferroelectric RAM (FRAM), etc.

With the development of new semiconductor manufacturing technologies, the level of integration of storage devices is rapidly increasing. Further, as a consequence, the capacity of these storage devices is also increasing. The high integration of a storage device may reduce the cost of manufacturing. However, due to the high integration of the storage device, a scale and reliability of the storage device is reduced. Thus, there is a demand for methods and devices that can improve reliability of the storage device.

SUMMARY

According to an exemplary embodiment of the inventive concept, an operation method of a data storage system including storage devices is provided. The operation method includes: transmitting, by the storage devices, a packet to a host, the packet including information indicating whether the storage devices are capable of resource sharing; transmitting, by the storage devices capable of the resource sharing, ID information of the corresponding storage devices to the host; transmitting, by a requesting device among the storage devices capable of the resource sharing, a resource sharing request message to the remaining storage devices; and performing the resource sharing on at least one of the remaining storage devices.

According to an exemplary embodiment of the inventive concept, a storage device is provided. The storage device includes a plurality of memory devices; and a controller controlling the memory devices, transmitting a packet to a host including information indicating whether the memory devices are capable of resource sharing, transmitting a processor or memory resource sharing request message to the storage devices capable of the resource sharing in response to receipt of ID information from the host identifying the storage devices capable of the resource sharing, and performing the resource in response to the processor or memory resource sharing request message.

According to an exemplary embodiment of the inventive concept, a data storage system is provided. The data storage system includes a central processing unit (CPU); a root complex connected to the CPU and receiving a transaction of the CPU; a system memory storing data occurring during an operation of the CPU or the root complex; an interface switch connected to the root complex; and a plurality of endpoint devices transmitting and receiving data through the interface switch. The root complex receives a configuration information packet including information indicating whether the endpoint devices are capable of resource sharing and transmits a packet including ID information identifying the endpoint devices capable of the resource sharing. The endpoint devices capable of the resource sharing share resources of each other.

According to an exemplary embodiment of the inventive concept, an operation method of a data storage system including storage devices is provided. The method includes: transmitting, by a requesting device among the storage devices, a request message to the remaining storage devices, the request message identifying a particular resource; transmitting, by the remaining storage devices, information to the requesting device indicating which sharable device among the remaining devices is capable of sharing the particular resource; and accessing, by the requesting device, the particular resource of the indicated sharable device.

BRIEF DESCRIPTION OF THE FIGURES

Exemplary embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

DETAILED DESCRIPTION

Figure 1:
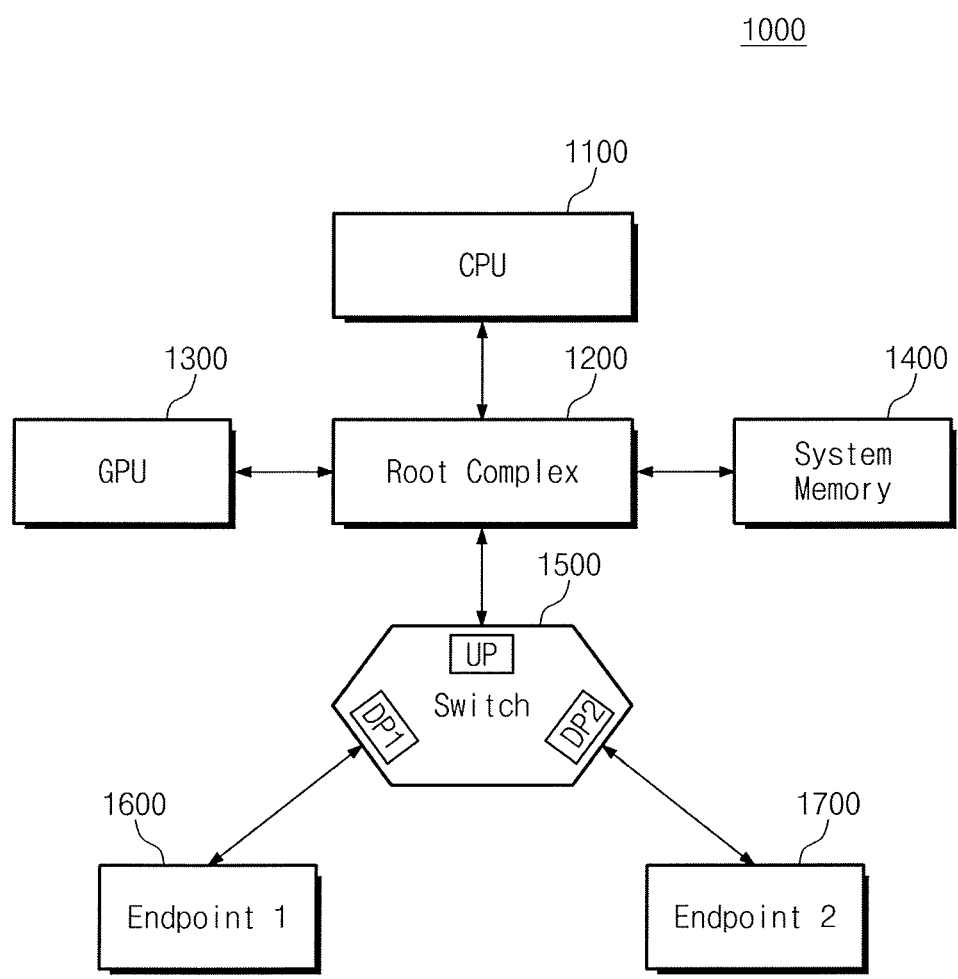
FIG. 1 is a block diagram illustrating a data storage system according to an exemplary embodiment of the inventive concept.

Embodiments of inventive concepts will be described more fully hereinafter with reference to the accompanying drawings, in which embodiments of the invention are shown. The inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout. As used herein, the singular forms "a", "an" and "the" are intended to include the plural forms as well, unless the context clearly indicates otherwise.

FIG. 1 is a block diagram illustrating a data storage system according to an exemplary embodiment of the inventive concept. Referring to FIG. 1, a data storage system 1000 includes a CPU (central processing unit) 1100, a root complex 1200, a GPU (graphic processing unit) 1300, a system memory 1400, a switch 1500, and first and second end point devices 1600 and 1700.

The CPU 1100 is connected to the root complex 1200. The CPU 1100 can control an overall operation of the data storage system 1000.

The root complex 1200 may be connected to the CPU 1100 through an internal bus. The root complex 1200 can manage transactions between the CPU 1100 and the endpoint devices 1600 and 1700. For example, the root complex 1200 can rout messages related to the transactions. The root complex 1200 may be directly connected to the endpoint devices 1600 and 1700 or may be connected to the endpoint devices 1600 and 1700 through at least one interface switch 1500. The root complex 1200 may be embodied by a device separated from the CPU 1100 or may be integrated into the CPU 1100. In an embodiment, the root complex 1200 is a processor, a microprocessor, etc.

The GPU 1300 may be connected to the root complex 1200. The GPU 1300 is a device being used to increase a graphic processing speed. The GPU 1300 can reduce a burden of the CPU 1100 by processing a graphic instead of the CPU 1100.

The system memory 1400 can communicate with the CPU 1100 through the root complex 1200. The system memory 1400 can store data necessary for driving the CPU 1100 or the root complex 1200. The system memory 1400 is controlled by the CPU 1100. The system memory 1400 may include a volatile memory such as a SRAM (static RAM), a DRAM (dynamic RAM), a SDRAM (synchronous DRAM), etc. and a nonvolatile memory such as a PRAM, a MRAM, an RRAM, a FRAM, etc.

The interface switch 1500 connects the root complex 1200 to the endpoint devices 1600 and 1700. The interface switch 1500 may be embodied to support a multicast operation of the root complex 1200 or a multicast operation between the endpoint devices 1600 and 1700. The multicast operation means an operation of transmitting one transmission packet to several places. In an exemplary embodiment, the multicast operation sends Internet Protocol (IP) datagrams to a group of interested receivers in a single transmission.

The interface switch 1500 may include an upstream port UP connected to the root complex 1200 and downstream ports DP1 and DP2 connected to the endpoint devices 1600 and 1700 respectively.

The endpoint devices 1600 and 1700 store data. Each of the endpoint devices 1600 and 1700 may be embodied to support a multicast operation. Each of the endpoint devices 1600 and 1700 may be a storage device embodied by a nonvolatile memory device. For example, each of the endpoint devices 1600 and 1700 may be a SSD (solid state drive) or a UFS (universal flash storage).

Each of the endpoint devices 1600 and 1700 may include a volatile memory such as a DRAM, a SDRAM, etc. or a nonvolatile memory such as a PRAM, a MRAM, an RRAM, a FRAM, etc.

In an exemplary embodiment of the inventive concept, the number of the endpoint devices is two or more. The endpoint devices 1600 and 1700 may be storage devices.

At initial setting, the endpoint devices 1600 and 1700 of the data storage system 1000 can transmit a message (or a packet) related to resource sharing to the rootZ complex 1200. In an exemplary embodiment, the initial setting occurs when the endpoint devices 1600 and 1700 are powered up. In an exemplary embodiment, the initial setting occurs when interface circuits of the devices 1600 and 1700 are initialized.

The endpoint devices 1600 and 1700 include information indicating whether a resource sharing is possible or not, and the endpoint devices 1600 and 1700 are capable of transmitting the information in a message (or a packet) to the root complex 1200. The root complex 1200 transmits a message (or packet) including information indicating which endpoint devices are capable of performing a resource sharing by a multicast operation to the endpoint devices 1600 and 1700 respectively. For example, if both endpoint devices 1600 and 1700 are capable of resource sharing, the root complex 1200 can send out a single message receivable by both devices 1600 and 1700 indicating that both endpoint devices are capable of resource sharing.

If the endpoint devices 1600 and 1700 are devices capable of resource sharing, they can share a processor resource or a memory resource. For example, when the resource is a memory resource and the endpoint devices 1600 and 1700 are capable of resource sharing, the endpoint devices 1600 and 1700 share the memory resource.

In an exemplary embodiment of the inventive concept, it is assumed that the interface switch 1500 and the endpoint devices 1600 and 1700 are implemented by a PCIe (peripheral component interconnect express) interface and the endpoint devices 1600 and 1700 are SSDs.

Figure 2:
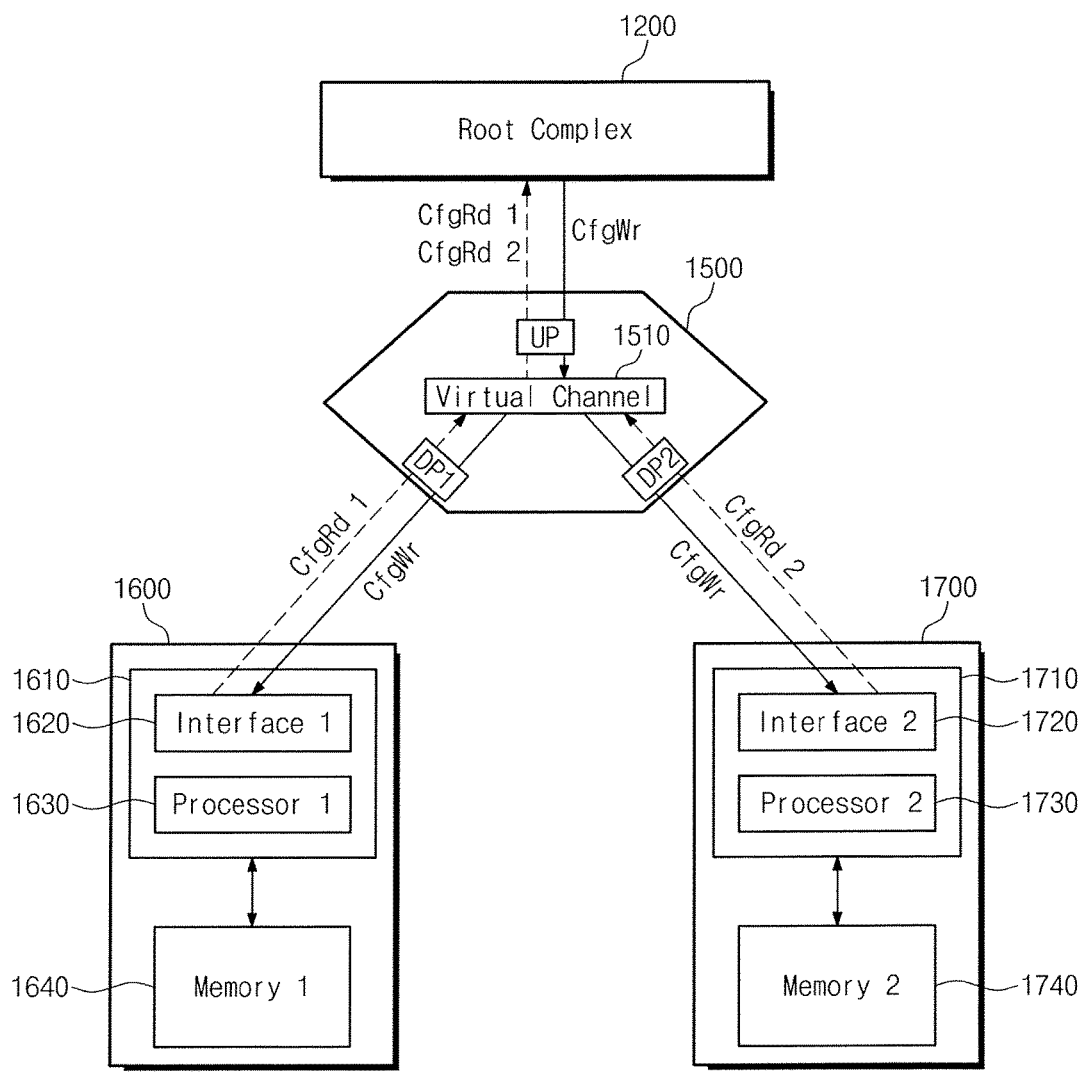
FIG. 2 is a block diagram illustrating a relation between switch and storage devices illustrated in FIG. 1.

FIG. 2 is a block diagram illustrating a relation between a switch and storage devices illustrated in FIG. 1. Referring to FIG. 2, the interface switch 1500 may include a virtual channel 1510, upstream port UP and downstream ports DP1 and DP2. It is assumed that the interface switch 1500 is embodied according to a PCIe interface specification.

The interface switch 1500 operates according to a traffic class and the virtual channel 1510 under the PCIe interface specification. The traffic class includes different tags depending on traffic importance. The virtual channel 1510 sets virtual routing information and transmits the traffic to a target channel. The virtual channel 1510 may be divided into a plurality of queues depending on the traffic class.

The interface switch 1500 is connected to the root complex 1200 through the upstream port UP.

The first storage device 1600 includes a first controller 1610 and a first memory 1640. The first controller 1610 may include a first interface 1620 and a first processor 1630. The second storage device 1700 includes a second controller 1710 and a second memory 1740. The second controller 1710 may include a second interface 1720 and a second processor 1730.

Each of the storage devices 1600 and 1700 are connected to the interface switch 1500 through the first and second interfaces 1620 and 1720, respectively. It is assumed that the first and second interfaces 1620 and 1720 are embodied according to the PCIe interface specification.

Referring to FIG. 2, at an initial setting, the first and second interface circuits 1620 and 1720 output packets CfgRd1 and CfgRd2 including configuration information of the storage devices 1600 and 1700 respectively. The packets CfgRd1 and CfgRd2 including the configuration information are transmitted to the root complex 1200 through the virtual channel 1510.

Information about whether the storage devices 1600 and 1700 perform a resource sharing is obtained through a specific pattern included in the packets CfgRd1 and CfgRd2 including the configuration information of the root complex 1200. If the storage devices 1600 and 1700 can perform a resource sharing, the root complex 1200 outputs a packet CfgWr including ID information of the storage devices 1600 and 1700 to the interface switch 1500.

The virtual channel 1510 of the interface switch 1500 outputs a packet CfgWr including ID information to the storage devices 1600 and 1700.

Figure 3:
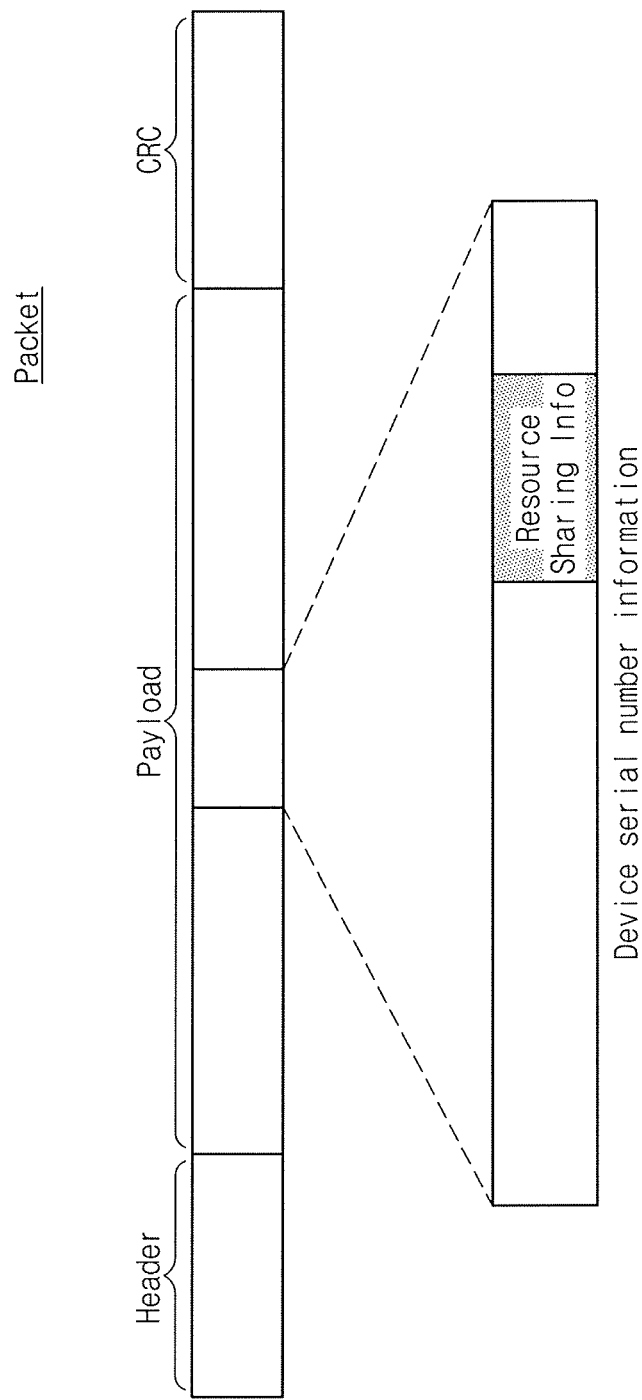
FIG. 3 is a block diagram illustrating a packet including resource sharing information according to an exemplary embodiment of the inventive concept.

FIG. 3 is a block diagram illustrating a packet including resource sharing information in accordance with an exemplary embodiment of the inventive concept. Referring to FIG. 3, at an initial setting, the packet includes configuration information of a storage device. The packet may include the same structure as the packets CfgRd1 and CfgRd2 including the configuration information of FIG. 2. In an exemplary embodiment, the packet includes a header, a payload and a cyclic redundancy check (CRC). The header includes information of a type of the packet and a length of the payload. That is, the header may include all the information that is not predetermined in the packet. In an embodiment, the header includes all information sufficient for routing the payload to a given destination.

The payload may include configuration information of the storage device. The configuration information may include a device ID, a vendor ID, and device serial number information. In an embodiment, the device serial number information includes the serial number of the device that the payload is to be transmitted to or the serial number of the device that the payload has been received from. Resource sharing information of the storage device is included in the device serial number information in the form of a specific pattern. The resource sharing information may be stored in an area allocated to a vendor inside the device serial number information. The area allocated to a vendor may be a reserved bit. A storage area of the resource sharing information is not limited to the device serial number information area. The resource sharing information may be stored in any place allocated to the vendor.

Figure 4:
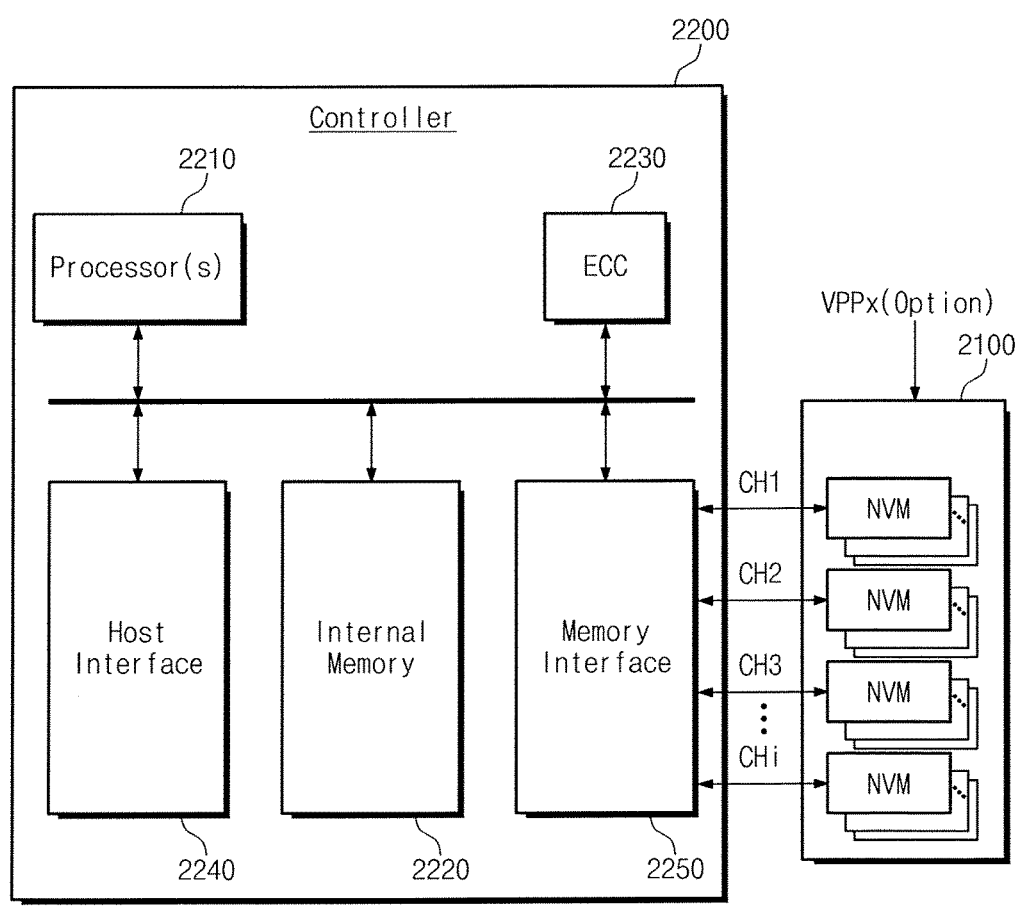
FIG. 4 is a block diagram illustrating a storage device according to an exemplary embodiment of the inventive concept.

FIG. 4 is a block diagram illustrating a storage device according to an exemplary embodiment of the inventive concept. The endpoint devices (storage devices) illustrated in FIGS. 1 and 2 may include the same structure as a storage device 2000 illustrated in FIG. 4. Referring to FIG. 4, the storage device 2000 includes a plurality of nonvolatile memory devices 2100 and a memory controller 2200 controlling the nonvolatile memory devices 2100. The storage device 2000 may be a SSD (solid state drive), an EMMC (embedded multimedia card), a UFS (universal flash storage), a SD (secure digital) card, or a USB device.

Each nonvolatile memory device 2100 may include a plurality of memory blocks implemented by memory cells storing at least one bit. Each nonvolatile memory device 2100 may be a NAND flash memory, a vertical NAND flash memory (VNAND) having memory cells being stacked in a direction perpendicular to a substrate, a NOR flash memory, a resistive random access memory (RRAM), a phase-change random access memory (PRAM), a magneto resistive random access memory (MRAM), a ferroelectric random access memory (FRAM), a spin transfer torque random access memory (STT-RAM), etc.

In an exemplary embodiment, each nonvolatile memory device 2100 is embodied to have a three-dimensional array structure. In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. In an embodiment of the present inventive concept, the 3D memory array includes vertical NAND strings that are vertically oriented such that at least one memory cell is located over another memory cell. The at least one memory cell may comprise a charge trap layer. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

The inventive concept can be applied to not only a flash memory device in which a charge storage layer is constituted by a conductive floating gate but also a CTF (charge trap flash) in which a charge storage layer is constituted by an insulating layer. The nonvolatile memory devices 2100 may be embodied to optionally receive an external high voltage Vpp. The memory controller 2200 is connected to the nonvolatile memory devices 2100 through a plurality of channels CH1~Chi (i is an integer of 2 or more). The memory controller 2200 includes at least one processor 2210, an internal memory 2220, an error correction circuit 2230, a host interface 2240 and a memory interface 2250.

The at least one processor 2210 can control an overall operation of the storage device 2000.

The internal memory 2220 temporarily stores data necessary for driving the memory controller 2200. For example, the internal memory 2220 can temporarily store input/output data when an input/output request from a host occurs. The internal memory 2220, in a write operation, temporarily stores data input from the outside to program it in the nonvolatile memory devices 2100. The internal memory 2220, in a read operation, temporarily stores data read from the nonvolatile memory devices 2100 to output it to the outside.

The internal memory 2220 may include a plurality of memory lines storing data or command. For example, the command may be an executable command. The memory lines may be mapped to cache lines directly being accessed by the processor 2210 in various ways. The cache lines may be present inside the processor 2210 or may be located outside the processor 2210.

The error correction circuit 2230 may be embodied to detect and correct an error of the input/output data. For example, the error correction circuit 2230 can calculate an error correction code value of data to be programmed in a write operation, correct an error of data read in a read operation based on the error correction code value and correct an error of data read from the nonvolatile memory device 2100 in a data restoration operation.

Although not illustrated in the drawing, the storage device 2000 may further include a code memory storing code data necessary for driving the memory controller 2200. The code memory may be embodied by a nonvolatile memory device, for example, a PRAM, a MRAM, etc.

The host interface 2240 can provide an interface function to interface with an external device (any one of the CPU 1100, the root complex 1200 and the other storage devices illustrated in FIG. 1). The host interface 2240, at initial setting, may be configured to output configuration information including information about whether the storage device 2000 shares resources. The host interface 2240 may receive a resource sharing request from the other storage devices.

The host interface 2240, if it is capable of a resource sharing, receives data and a code for an arithmetic operation and data for storage from the other storage devices. The host interface 2240 may transmit the data or the code for an arithmetic operation received from the other storage devices to the processor 2210. The host interface 2240 may also transmit the data for storage to the nonvolatile memory device 2100 through the memory interface 2250. The host interface 2240 may be a PCIe interface, a thunderbolt interface and a network interface.

The memory interface 2250 may provide an interface function to interface with the nonvolatile memory device 2100.

The storage device 2000 capable of a resource sharing may issue or receive a packet including resource sharing information. The processor 2210 or the nonvolatile memory device 2100 may be shared between storage devices.

Figure 5:
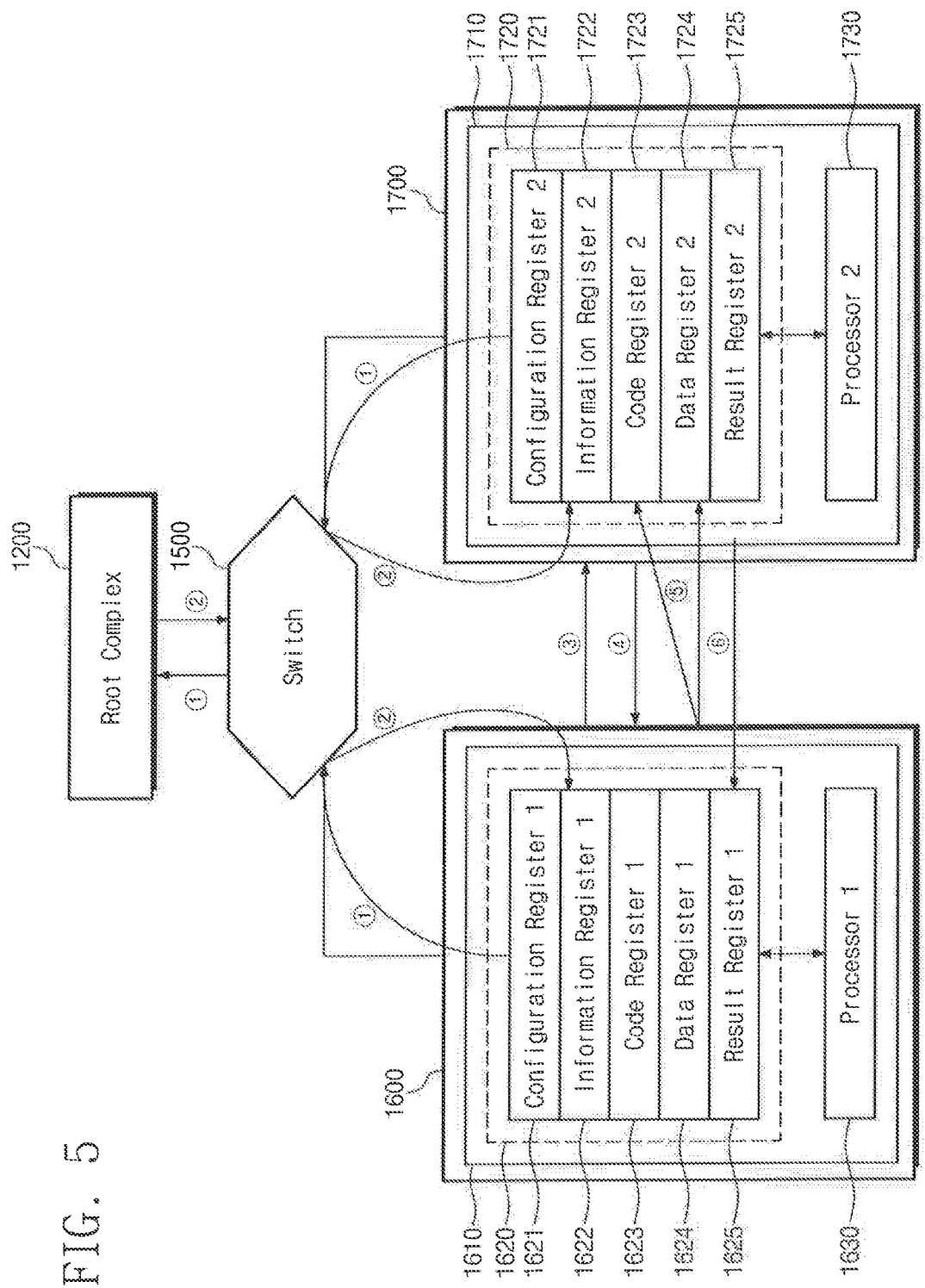
FIG. 5 is a block diagram illustrating a resource sharing method according to an exemplary embodiment of the inventive concept.

FIG. 5 is a block diagram illustrating a resource sharing method according to an exemplary embodiment of the inventive concept. FIG. 5 is a perspective view for explaining a processor resource sharing of the storage devices 1600 and 1700. Referring to FIG. 5, the storage devices 1600 and 1700 share a processor resource of controllers 1610 and 1710 through an interface switch 1500 and a root complex 1200. The storage devices 1600 and 1700 of FIG. 5 may include a volatile memory such as a DRAM, a SDRAM, etc. or a nonvolatile memory device such as a PRAM, a MRAM, an RRAM, a FRAM, etc.

A first interface 1620 of the first storage device 1600 includes a first configuration register 1621, a first information register 1622, a first code register 1623, a first data register 1624 and a first result register 1625.

A second interface 1720 of the second storage device 1700 includes a second configuration register 1721, a second information register 1722, a second code register 1723, a second data register 1724 and a second result register 1725.

At an initial setting, the root complex 1200 reads configuration information of the first and second storage devices 1600 and 1700 from the first and second configuration registers 1621 and 1721 ①. The root complex 1200 receives a packet including configuration information of the first and second storage devices 1600 and 1700 from the first and second configuration registers 1621 and 1721. Resource sharing information is included in an area allocated to a vendor of the packet. In an embodiment, the resource sharing information indicates whether the first and second storage devices 1600 and 1700 are capable of sharing a resource.

If the first and second storage devices 1600 and 1700 support resource sharing, the root complex 1200 transmits ID information of the first and second storage devices 1600 and 1700 to the first and second information registers 1622 and 1722 ②. In an embodiment, the ID information of the first storage device identifies the first storage device, the ID information of the second storage device identifies the second storage device, and the ID information for each device are different so that the devices can be distinguished from one another. Thus, the first and second storage devices 1600 and 1700 can share resources of each other. The resource may be a processor resource, a memory resource, etc. In an embodiment, when a first device shares a processor resource of a second device, a processor of the second device performs an operation or process on behalf of the first device.

The first storage device 1600 transmits a processor resource sharing request message to the second storage device 1700 to request sharing of a processor resource ③.

In response to receipt of the processor resource sharing request message, the second storage device 1700 transmits a message indicating whether resource sharing is possible or not at this time to the first storage device 1600 ④. If a second processor 1730 can perform an additional arithmetic operation, a message including resource shareable information is transmitted to the first storage device 1600. In an embodiment, the resource shareable information indicates that the second processor 1730 can perform the additional arithmetic operation. If the second processor 1730 cannot perform an additional arithmetic operation, the second processor 1730 transmits a message including resource unshareable information to the first storage device 1600. In an embodiment, the resource unshareable information indicates that the second processor 1730 cannot currently perform the additional arithmetic operation.

In an embodiment, the first storage device 1600 blocks for a period of time and checks whether the second processor 1730 has sent a new message including resource shareable information to determine whether the second processor 1730 has switched from being incapable of performing the additional operation to being capable of performing the additional operation. This process can then be repeated a certain number of times.

If the second storage device 1700 can perform resource sharing, the first storage device 1600 transmits a message including data for an arithmetic operation and a code to the second storage device ⑤. The first storage device 1600 transmits the code and the data from the message to the second code register 1723 and the second data register 1724 respectively. The second code register 1723 and the second data register 1724 transmit the received code and data to the second processor 1730. The second processor 1730 performs an operation on the code and the data. The second processor 1730 transmits a result of the operation to the second result register 1725.

The second result register 1725 transmits a message including operation result information including the result to the first storage device 1600 ⑥. The second result register

1725 transmits a message including the operation result information to the first result register 1625. The first result register 1625 can read the message including the operation result information from the second result register 1725.

The second storage device 1700 can request a resource sharing at the first storage device 1600 and the first storage device 1600 can perform an arithmetic operation for the second storage device 1700 instead.

A processor resource can be shared between the resource shareable storage devices 1600 and 1700.

Figure 6:
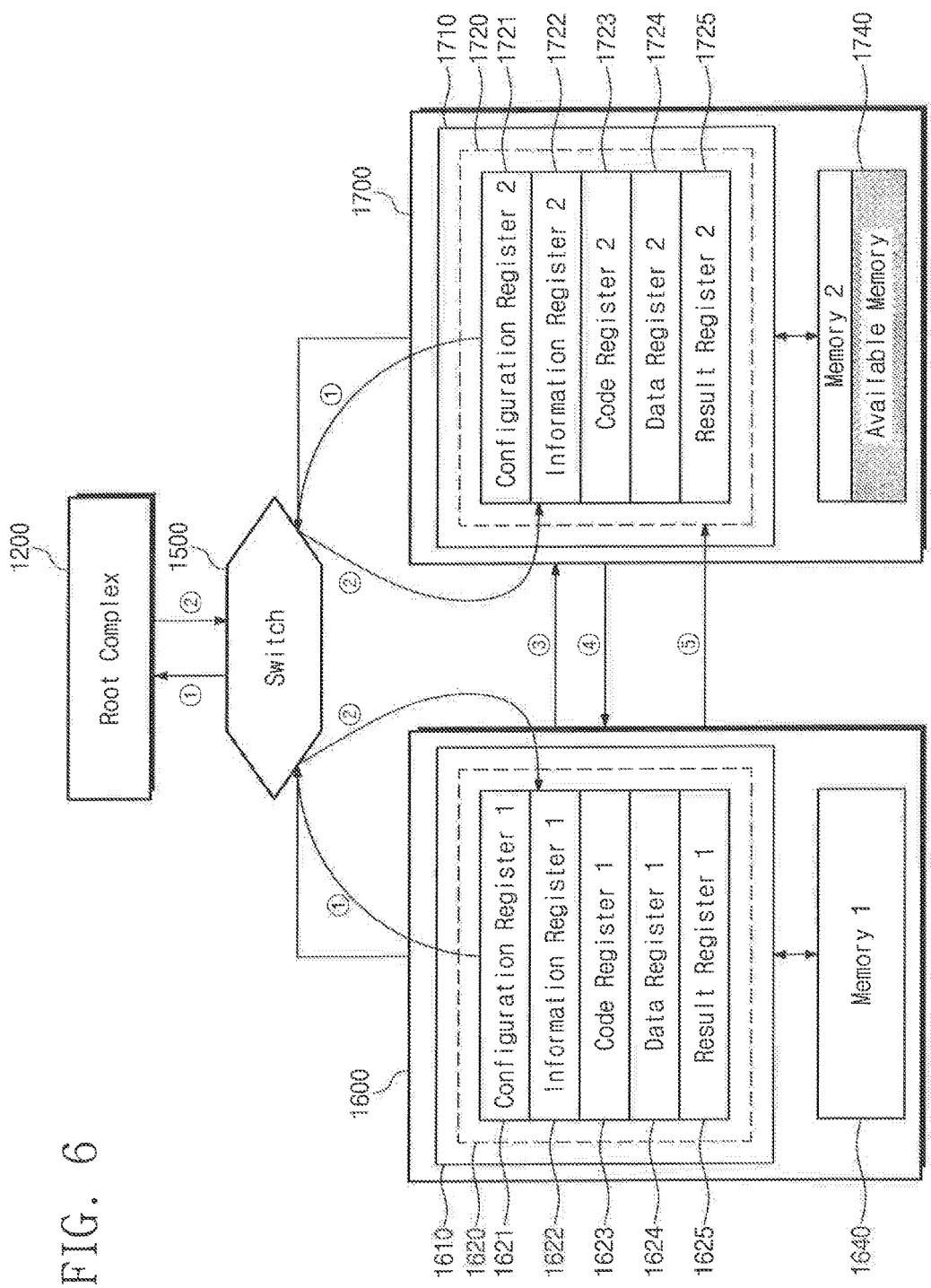
FIG. 6 is a block diagram illustrating a resource sharing method according to an exemplary embodiment of the inventive concept.

FIG. 6 is a block diagram illustrating a resource sharing method in accordance with an exemplary embodiment of the inventive concept. FIG. 6 is a perspective view for explaining a processor resource sharing of storage devices 1600 and 1700. Referring to FIG. 6, the storage devices 1600 and 1700 can share resources of first and second memories 1640 and 1740 through an interface switch 1500 and a root complex 1200.

The configurations of the first and second interfaces 1610 and 1710 are the same as those of the first and second interfaces 1610 and 1710 illustrated in FIG. 5.

At an initial setting, the root complex 1200 reads configuration information of the first and second storage devices 1600 and 1700 from the first and second configuration registers 1621 and 1721 ①. The root complex 1200 receives a packet including configuration information of the first and second storage devices 1600 and 1700 from the first and second configuration registers 1621 and 1721. Resource sharing information is included in an area allocated to a vendor of the packet.

If the first and second storage devices 1600 and 1700 support resource sharing, the root complex 1200 transmits ID information of the first and second storage devices 1600 and 1700 to the first and second information registers 1622 and 1722 ②. Thus, the first and second storage devices 1600 and 1700 can share resources of each other. The resource may support a processor resource, a memory resource, etc.

The first storage device 1600 transmits a memory resource sharing request message to the second storage device 1700 to request sharing of a memory resource ③.

In response to the memory resource sharing request message, the second storage device 1700 transmits a message indicating whether resource sharing is possible or not to the first storage device 1600 ④. When an available memory area is present in the second memory 1740, a message including memory resource shareable information is transmitted to the first storage device 1600. When an available memory area is not present in the second memory 1740, a message including memory resource unshareable information is transmitted to the first storage device 1600. In an embodiment, the memory resource shareable information indicates that a memory area to be shared is present, and the memory resource unshareable information indicates that a memory area to be shared is not currently present.

In an embodiment, the first storage device 1600 blocks for a period of time and checks whether the second processor 1730 has sent a new message including resource shareable information to determine the state of the memory area has switched from being unavailable to being available. This process can then be repeated a certain number of times.

If an available memory area is present in the second storage device 1700, the first storage device 1600 transmit a message including data that has to be stored to the second storage device 1700 ⑤. The first storage device 1600 transmits a message including data that has to be stored to a second interface 1720. Data for storage is programmed in an available memory area of the second memory 1740 through the second interface 1720. The first storage device 1600 can read data programmed in the second memory 1740.

The second storage device 1700 can request a resource sharing at the first storage device 1600 and the first storage device can store data for the second storage device 1700 instead.

In an exemplary embodiment, when a resource being shared is a free block, the first and second storage devices 1600 and 1700 do not perform a garbage collection. The garbage collection is an operation of selecting a victim block, copying a valid page of the victim block to the free block, erasing the victim block and then forming the victim block into the free block.

When performing garbage collection, the more valid pages present in the victim block, the more times a valid page is copied. An increase in the number of times the valid page is copied may cause performance degradation of the storage device. As the number of times the victim block is erased and the valid page is copied to obtain the free block increases, the lifespan of the storage device may be further reduced.

Thus, by sharing a memory resource between the storage devices 1600 and 1700, the lifespan of the storage device may increase and program and read speeds of data may increase.

Figure 7:
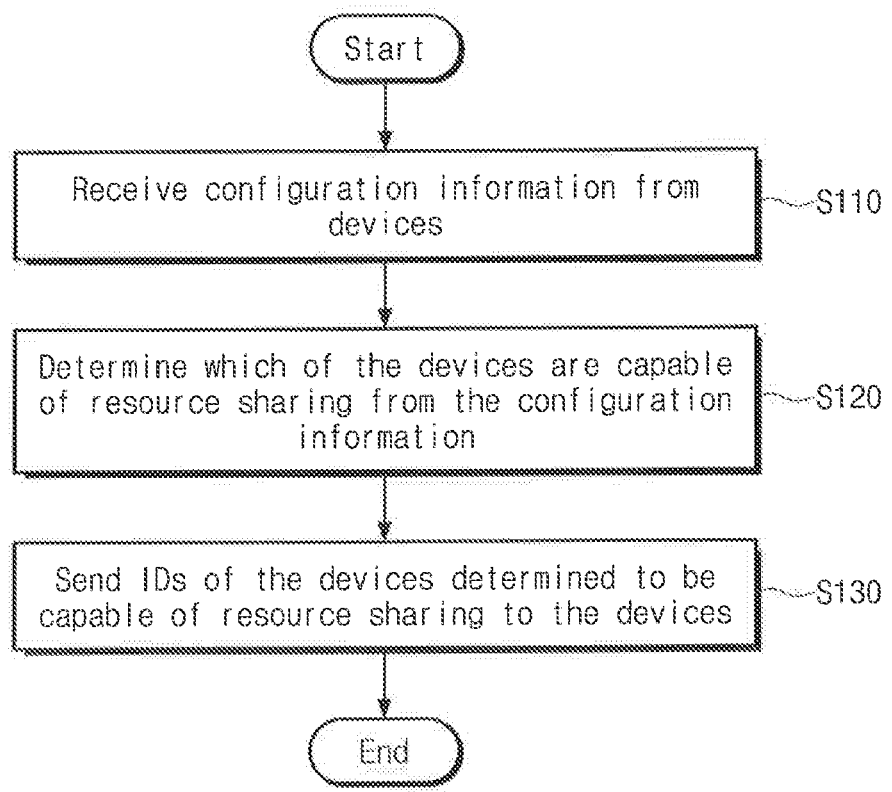
FIG. 7 is a flowchart illustrating whether storage devices in accordance with an exemplary embodiment of the inventive concept can share resources or not.

FIG. 7 is a flowchart illustrating whether storage devices according to an exemplary embodiment of the inventive concept can share resources or not. Referring to FIGS. 5 through 7, in a step S110, the root complex 1200 reads a packet including configuration information from the first and second storage devices 1600 and 1700. The configuration information includes information about a resource sharing of the first and second storage devices 1600 and 1700.

In a step S120, the root complex 1200 obtains information indicating whether the storage devices are capable of resource sharing. The root complex 1200 can obtain information indicating whether resource sharing is possible through the configuration information received from the storage devices 1600 and 1700.

Information about a resource sharing of the storage devices may be stored in an area of the packet allocated to a vendor among configuration information.

In a step S130, the root complex 1200 transmits a packet including ID information of resource sharable storage devices to all the storage devices. If both the first and second storage devices 1600 and 1700 can share a resource, the root complex 1200 transmits a packet including ID information of the first and second storage devices 1600 and 1700 to the first and second storage devices 1600 and 1700, respectively. Thus, the first and second storage devices 1600 and 1700 can share resources of each other.

Figure 8:
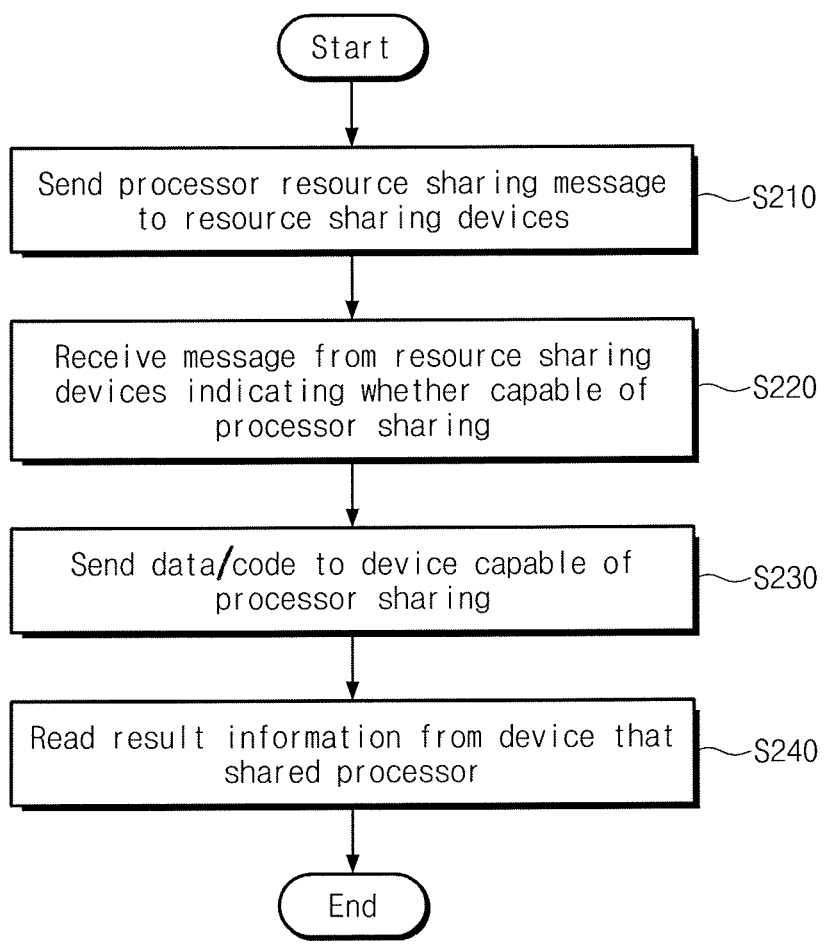
FIG. 8 is a flowchart illustrating a processor resource sharing method according to an exemplary embodiment of the inventive concept.

FIG. 8 is a flowchart illustrating a processor resource sharing method according to an exemplary embodiment of the inventive concept. Referring to FIGS. 5, 7 and 8, in a step S210, a storage device transmits a message requesting processor resource sharing to other resource sharing storage devices. If the first storage device 1600 is the requesting storage device, the first storage device 1600 transmits a message requesting processor resource sharing to the second storage device 1700. It is assumed that the first and second storage devices 1600 and 1700 are resource sharing storage devices.

In a step S220, the storage device requesting the processor resource sharing receives a message indicating whether processor sharing is possible from other resource sharing storage devices. The first storage device 1600 receives a message indicating whether processor sharing is possible from the second storage device 1700.

In a step S230, in response to the message indicating the other device is capable of sharing its processor, the storage device requesting the processor resource sharing transmits a message including a code and data that has to be calculated by a storage device capable of processor sharing. If the second storage device 1700 can perform processor sharing, the first storage device 1600 transmits code and data necessary for an arithmetic operation to the second interface 1720 of the second storage device 1700. The second interface 1720 transmits the code and data necessary for an arithmetic operation to the second processor 1730. The second processor 1730 performs an arithmetic operation using the code and the data to generate arithmetic result information. The second processor 1730 transmits the arithmetic result information to the second interface 1720.

In a step S240, the storage device requesting the processor resource sharing can read an arithmetic result from the storage device that performed the processor sharing. The first storage device 1600 reads a message including the arithmetic result information from the second storage device 1700. The second storage device 1700 can transmit a message including the arithmetic result information to the first storage device 1600.

Figure 9:
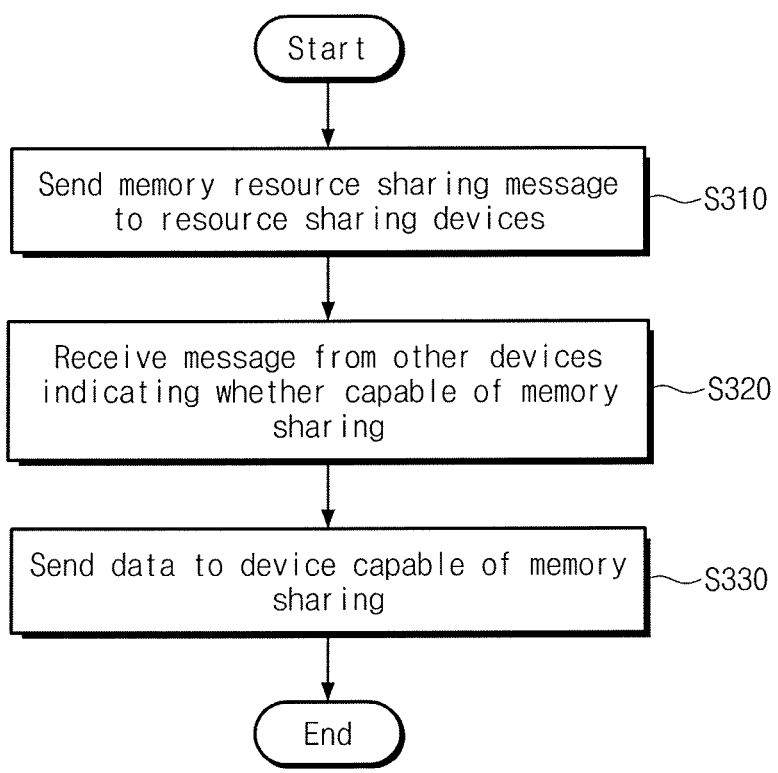
FIG. 9 is a flowchart illustrating a memory resource sharing method according to an exemplary embodiment of the inventive concept.

FIG. 9 is a flowchart illustrating a memory resource sharing method according to an exemplary embodiment of the inventive concept. Referring to FIGS. 6, 7 and 9, in a step 310, a storage device transmits a message requesting memory resource sharing to other resource sharing storage devices. If the first storage device 1600 is the requesting storage device, the first storage device 1600 transmits a message requesting memory resource sharing to the second storage device 1700. It is assumed that the first and second storage devices 1600 and 1700 are resource sharing storage devices.

In a step S320, the storage device requesting the memory resource sharing receives a message indicating whether memory sharing is possible from other resource sharing storage devices. The first storage device 1600 receives a message indicating whether a memory sharing is possible from the second storage device 1700.

In a step S330, in response to the message indicating the other device is capable of sharing its memory, the storage device requesting the memory resource sharing transmits a message including data to the storage device capable of sharing the memory. If the second storage device 1700 can share its memory, the first storage device 1600 transmits data to be programmed to the second interface 1720 of the second storage device 1700. The second interface 1720 transmits the data to be programmed to the second processor 1730. The data is programmed in an available memory area of the second memory.

Figure 10:
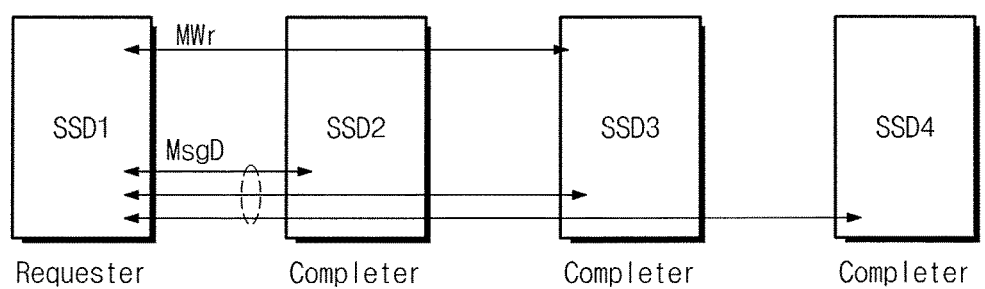
FIG. 10 is a block diagram illustrating a message transmission method of storage devices according to an exemplary embodiment of the inventive concept.

FIG. 10 is a block diagram illustrating a message transmission method of storage devices according to an exemplary embodiment of the inventive concept. FIG. 10 is a drawing for illustrating a resource sharing method among two or more storage devices. Referring to FIG. 10, it is assumed that first through fourth storage devices SSD1~SSD4 are storage devices capable of performing resource sharing. The first storage device SSD1 transmits and receives a processor resource sharing requesting message and messages MsgD indicating whether resource sharing is possible to and from the second through fourth storage devices SSD2'~SSD4.

If the third storage device SSD3 among the second through fourth storage devices SSD2'~SSD4 can share a processor resource, the first storage device SSD1 transmits a message MWr including a code and data that has to be calculated by the third storage device SSD3. The third storage device SSD3 transmits a message MWr including arithmetic result information to the first storage device SSD1. The arithmetic result information is a result of performing an operation on the data. The code may indicate the particular arithmetic operation that is to be performed.

Figure 11:
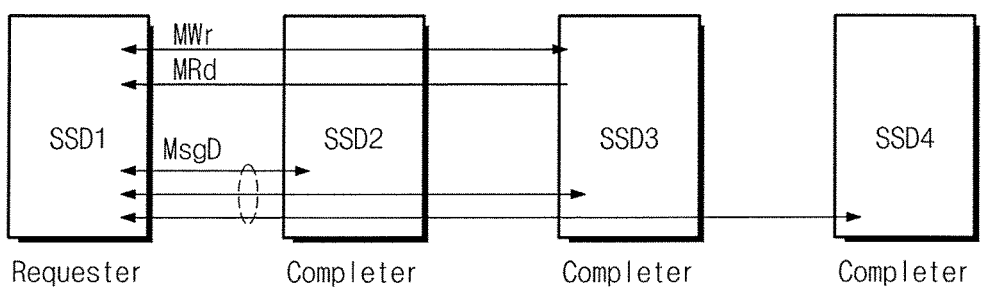
FIG. 11 is a block diagram illustrating a message transmission method of storage devices according to an exemplary embodiment of the inventive concept.

FIG. 11 is a block diagram illustrating a message transmission method of storage devices according to an exemplary embodiment of the inventive concept. Referring to FIG. 11, it is assumed that first through fourth storage devices SSD1~SSD4 are storage devices capable of performing a resource sharing. The first storage device SSD1 transmits and receives a processor resource sharing requesting message and messages MsgD indicating whether a resource sharing is possible to and from the second through fourth storage devices SSD2~SSD4.

If the third storage device SSD3 among the second through fourth storage devices SSD2~SSD4 can share a memory resource, the first storage device SSD transmits a message MWr including data that has to be stored in the third storage device SSD3. The first storage device SSD1 may receive a message MRd when reading programmed data from the third storage device SSD3. The message MRd may include the data programmed into the third storage device SSD3.

Figure 12:
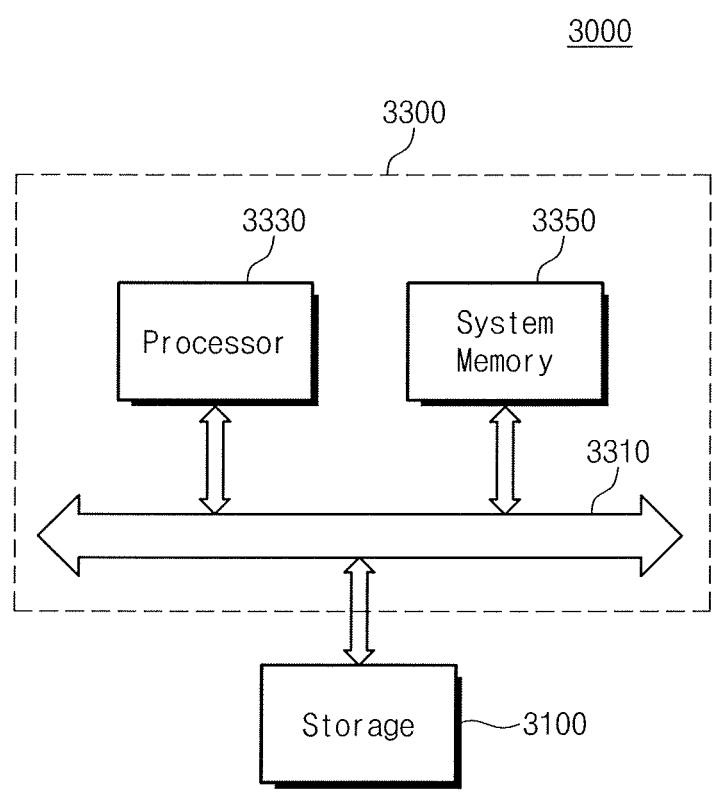
FIG. 12 is a block diagram illustrating a data storage system according to an exemplary embodiment of the inventive concept.

FIG. 12 is a block diagram illustrating a data storage system according to an exemplary embodiment of the inventive concept. FIG. 12 is a block diagram illustrating a configuration of a computing device including a storage device according to an exemplary embodiment of the inventive concept. The computing system 3000 includes a storage device 3100 and a host 3300. The host 3300 includes a bus 3310, a processor 3330 and a system memory 3350. The storage device 3100 may have the same configuration as the storage device 2000 illustrated in FIG. 4.

The bus 3310 may provide a communication channel among constituent elements of the computing system 3000. For instance, the bus 3310 may provide a communication channel among the storage device 3100, the processor 3330 and the system memory 3350. The bus 3310 may provide a communication channel among other constituent elements not illustrated in FIG. 12. The bus 3310 may operate according to a standard interface specification of the computing system 3000. The bus 3310 may operate according to a PCIe specification. However, the inventive concept is not limited thereto as the bus 3310 may operate according to various communication specifications or protocols.

The processor 3330 can control constituent elements of the computing system 3000 through the bus 3310. For instance, the processor 3330 can control the system memory 3350 and the storage device 3100 through the bus 3310. The processor 3330 can control constituent elements of the computing system 3000 according to the PCIe specification. The processor 3330 may be a general-purpose CPU (central processing unit) or an application processor.

The system memory 3350 can communicate with the processor 3330 and the storage device 3100 through the bus 3310. The system memory 3350 may include a volatile memory such as a SRAM (static RAM), a DRAM (dynamic RAM), a SDRAM (synchronous DRAM), etc. or a nonvolatile memory such as a PRAM, a MRAM, an RRAM, etc.

The host 3300 can read data stored in the storage device 3100 or transmit data to be stored in the storage device 3100.

The storage device 3100 may include the memory controller 2200 (refer to FIG. 4). The memory controller 2200 may have device information recognized by the bus 3310 or the processor 3330. For instance, if the storage device 3100 is connected to the bus 3310 through a connector (not shown), the memory controller 2200 can perform a predetermined communication with the bus 3310 or the processor 3330. By performing a predetermined communication, the storage device 3100 can be identified as a storage device by the bus 3310 or the processor 3330.

A data storage system according to at least one embodiment of the inventive concept can effectively manage data by judging whether storage devices share resources at an initial setting and sharing resources of a memory and a processor between storage devices capable of sharing resources.

While the inventive concept has been described with reference to exemplary embodiments thereof, it will be apparent to those skilled in the art that various changes and modifications may be made without departing from the spirit and scope of the inventive concept. Therefore, it should be understood that the above embodiments are not limiting, but illustrative.

What is claimed is:

1. An operation method of a data storage system including storage devices comprising:
   transmitting, by the storage devices, a packet to a host, the packet including configuration information indicating whether the storage devices support resource sharing;
   transmitting, by the host, ID information indicating which of the storage devices support the resource sharing to the storage devices to the storage devices, in response to the configuration information;
   transmitting, by a requesting device among the storage devices supporting the resource sharing, a resource sharing request message to the remaining storage devices supporting the resource sharing, in response to the ID information; and
   performing the resource sharing on a selected device among the remaining storage devices upon the requesting device receiving a message from the selected device indicating resource sharing can currently be performed by the selected device.

2. The operation method of claim 1, the performing further comprising:
   transmitting, by the requesting device, a message including data and code information to the selected device;
   performing, by the selected device, an arithmetic operation using the data and the code information; and
   transmitting, by the selected device, a result of the arithmetic operation to the requesting device.

3. The operation method of claim 2, wherein the arithmetic operation is performed in a processor included in a controller of the selected device.

4. The operation method of claim 1, the performing further comprising:
   transmitting, by the requesting device, a message including data that has to be stored to the selected device; and
   programming the data that has to be stored in an area of an available memory of the selected device.

5. The operation method of claim 4, wherein the area of the available memory is a free block.

6. The operation method of claim 1, wherein the packet comprises a payload area, the payload area comprises device serial number information that includes a serial number and the configuration information indicating whether the devices support the resource sharing.

7. A storage device comprising:
   a plurality of memory devices; and
   a controller controlling the memory devices, transmitting a packet to a host including configuration information indicating whether the memory devices support resource sharing, transmitting a processor or memory resource sharing request message from a requesting device among the storage devices supporting the resource sharing to the remaining storage devices supporting the resource sharing in response to receipt of ID information from the host identifying the storage devices supporting the resource sharing, and performing the resource sharing on a selected device among on the remaining devices upon receiving a message from the selected device indicating resource sharing can currently be performed by the selected device.

8. The storage device of claim 7, wherein the selected device sends the message indicating the resource sharing can currently be performed upon determining that a memory area of the selected device is available, and the controller shares the available memory area.

9. The storage device of claim 8, wherein the controller shares the available memory area by sharing a free block that is excluded from garbage collection.

10. The storage device of claim 7, wherein the selected device sends the message indicating the resource sharing can currently by performed upon determining that a processor of the selected device is capable of performing an additional arithmetic operation, and the controller shares the processor.

11. The storage device of claim 7, wherein the controller further comprises an interface including a plurality of registers for inputting and outputting the processor or memory resource sharing request message and sharing a processor or memory resource.

12. The storage device of claim 11, wherein the interface is a peripheral component interconnection express (PCIe) interface.

13. The storage device of claim 7, wherein the storage device is a dynamic random access memory (DRAM).

14. The storage device of claim 7, wherein at least one of the plurality of memory devices comprises a three-dimensional memory array,
   wherein the three dimensional memory array comprises a plurality of memory cells, each of the memory cells including a charge trap layer.

15. A data storage system comprising:
   a central processing unit (CPU);
   a root complex connected to the CPU and receiving a transaction from the central processing unit;
   a system memory storing data used during an operation of the CPU or the root complex;
   an interface switch connected to the root complex; and
   a plurality of endpoint devices transmitting and receiving data through the interface switch,
   wherein the root complex receives a configuration information packet from the endpoint devices including configuration information indicating whether the endpoint devices support resource sharing and transmits a packet including ID information identifying the endpoint devices supporting the resource sharing to the endpoint devices using the configuration information, and
   wherein a first device among the endpoint devices supporting the resource sharing, shares a resource of the first device with a second other device among the endpoint devices after the first device sends a message to the second device indicating the first device is currently capable of performing the resource sharing.

16. The data storage system of claim 15, wherein the reception of the configuration information packet by the root complex and the transmission of the packet including the ID information by the root complex are performed at an initial setting of the interface.

17. An operation method of a data storage system including storage devices supporting resource sharing, the method comprising:

transmitting, by a requesting device among the storage devices, a request message to a selected device among the remaining storage devices, the request message identifying a particular resource;

transmitting, by the selected device, a message to the requesting device indicating whether the selected device is currently able to perform the resource sharing;

blocking, by the requesting device, for a period of time if the message indicates the selected device is currently unable to perform the resource sharing; and accessing, by the requesting device, the particular resource of the selected device if the message indicates the selected device is currently able to perform the resource sharing.

18. The operation method of claim 17, wherein the accessing comprises:

transmitting, by the requesting device, a message including data and code information to the selected device;

performing, by the selected device, an arithmetic operation using the data and the code information; and transmitting, by the selected device, a result of the arithmetic operation to the requesting device.

19. The operation method of claim 17, wherein the accessing comprises:

transmitting, by the requesting device, a message including data to the selected device; and programming the data in an area of an available memory of the selected device.

20. The operation method of claim 19, wherein the area of the available memory is a free block.

* * * * *